United States Patent
Kameda et al.

(10) Patent No.: US 10,670,147 B2
(45) Date of Patent: Jun. 2, 2020

(54) SLIDING MEMBER AND PISTON RING

(71) Applicant: KABUSHIKI KAISHA RIKEN, Chiyoda-ku Tokyo (JP)

(72) Inventors: Kazuya Kameda, Tokyo (JP); Hiroshi Maruyama, Tokyo (JP); Yuuichi Ishida, Tokyo (JP); Takuma Sekiya, Tokyo (JP)

(73) Assignee: KABUSHIKI KAISHA RIKEN, Chiyoda-ku, Tokyo (JP)

( * ) Notice: Subject to any disclaimer, the term of this patent is extended or adjusted under 35 U.S.C. 154(b) by 0 days.

(21) Appl. No.: 16/487,603

(22) PCT Filed: Oct. 24, 2018

(86) PCT No.: PCT/JP2018/039512
§ 371 (c)(1),
(2) Date: Aug. 21, 2019

(87) PCT Pub. No.: WO2019/130769
PCT Pub. Date: Jul. 4, 2019

(65) Prior Publication Data
US 2020/0056700 A1    Feb. 20, 2020

(30) Foreign Application Priority Data

Dec. 27, 2017  (JP) ................................ 2017-251863

(51) Int. Cl.
*F16J 9/26* (2006.01)
*C23C 14/06* (2006.01)
(Continued)

(52) U.S. Cl.
CPC ............. *F16J 9/26* (2013.01); *C23C 14/0605* (2013.01); *F02F 5/00* (2013.01); *F16C 33/10* (2013.01); *F16C 33/12* (2013.01)

(58) Field of Classification Search
USPC .................. 277/442; 428/217, 336, 408, 698
See application file for complete search history.

(56) References Cited

U.S. PATENT DOCUMENTS

| | | | |
|---|---|---|---|
| 2011/0268946 A1* | 11/2011 | Fischer | C23C 30/00 428/217 |
| 2015/0226260 A1* | 8/2015 | Inami | F16C 33/16 508/109 |
| 2016/0341312 A1* | 11/2016 | Kennedy | C23C 16/32 |

FOREIGN PATENT DOCUMENTS

| | | |
|---|---|---|
| JP | 2006250348 A | 9/2006 |
| JP | 2009167512 A | 7/2009 |
| WO | 2017150571 A1 | 9/2017 |

OTHER PUBLICATIONS

Apr. 2, 2019, Decision to Grant a Patent issued by the Japan Patent Office in the corresponding Japanese Patent Application No. 2017-251863.

(Continued)

*Primary Examiner* — Archene A Turner
(74) *Attorney, Agent, or Firm* — Kenja IP Law PC

(57) ABSTRACT

Provided is a sliding member having a hard carbon coating that makes high wear resistance compatible with a low coefficient of friction and that has excellent peeling resistance. A sliding member (100) includes a base member (10) and a hard carbon coating (12) formed on the base member (10). The indentation hardness of the hard carbon coating (12) decreases gradually from the base member side to the surface side. The hard carbon coating (12) has an indentation hardness distribution at $0 \leq T/T_{total} \leq 0.6$ approximated by a first line and an indentation hardness distribution at $0.9 \leq T/T_{total} \leq 1$ approximated by a second line, and the intersection between the first line and the second line (T2/Ttotal, H2) satisfies Expression (1), $(H3-H1) \times T2/T_{total} + H1 < H2 \leq 0.9 \times H1$, and Expression (2), $0.6 \leq T2/T_{total} \leq 0.9$.

9 Claims, 5 Drawing Sheets

(51) Int. Cl.
*F02F 5/00* (2006.01)
*F16C 33/10* (2006.01)
*F16C 33/12* (2006.01)

(56) References Cited

OTHER PUBLICATIONS

Jan. 29, 2019, International Search Report issued in the International Patent Application No. PCT/JP2018/039512.

\* cited by examiner

SLIDING MEMBER AND PISTON RING

TECHNICAL FIELD

The present disclosure relates to a sliding member having a hard carbon coating that combines high wear resistance with a low coefficient of friction and has excellent peeling resistance. The present disclosure also relates to a piston ring formed by the sliding member.

BACKGROUND

The hardness and wear resistance of a sliding member, such as a piston ring, are typically improved by coating the base member with a hard carbon coating, such as a diamond-like carbon (DLC) coating.

One of the objectives of patent literature (PTL) 1 is to provide a sliding member that has a hard DLC coating with excellent wear resistance. PTL 1 discloses a sliding member that has a base member, an intermediate layer formed on the base member, and a DLC coating formed on the intermediate layer by ion plating. PTL 1 discloses that the indentation hardness of the coating is preferably 20 GPa to 70 GPa.

One of the objectives of PTL 2 is to make high durability compatible with a low coefficient of friction. PTL 2 discloses a sliding member that has a base member, a lower layer coating made of DLC and formed on the base member by ion plating, and an upper layer coating made of DLC and formed on the lower layer coating by CVD. The indentation hardness of the lower layer coating is 20 GPa or more and 45 GPa or less, and the indentation hardness of the upper layer coating is 5 GPa or more and 20 GPa or less.

CITATION LIST

Patent Literature

PTL 1: JP2006-250348A
PTL 2: JP2009-167512A

SUMMARY

Technical Problem

The DLC coating formed by the method in PTL 1 has a constant indentation hardness at the surface layer and has a high hardness of 20 GPa to 70 GPa. This yields good wear resistance, but leaves room for improvement in workability.

PTL 2 provides a sliding member in which the upper layer coating is softer than the lower layer coating in an attempt to improve the workability by having the upper layer coating function as a conforming layer. With this method, however, the indentation hardness at the boundary between the upper layer coating and the lower layer coating changes discontinuously, causing the upper layer coating to peel.

In light of these problems, it is an objective of the present disclosure to provide a sliding member having a hard carbon coating that combines high wear resistance with a low coefficient of friction and has excellent peeling resistance. It is also an objective of the present disclosure to provide a piston ring formed by the sliding member. Additionally, it is an objective of the present disclosure to provide a sliding member that is easy to produce industrially by virtue of having improved workability and a piston ring formed by the sliding member.

Solution to Problem

Upon examining how to resolve the aforementioned problem, we discovered that gradually reducing the indentation hardness of the hard carbon coating from the base member side toward the surface side and setting the indentation hardness distribution to a predetermined shape in the thickness direction of the hard carbon coating yields a sliding member having a hard carbon coating that combines high wear resistance with a low coefficient of friction and has excellent peeling resistance.

The present disclosure was completed on the basis of these discoveries, and the primary features are as follows.

[1] A sliding member comprising a base member and a hard carbon coating formed on the base member;
wherein an indentation hardness of the hard carbon coating decreases gradually from the base member side to a surface side of the hard carbon coating;
wherein the hard carbon coating has an indentation hardness distribution at $0 \leq T/T\text{total} \leq 0.6$ that is approximated by a first line having $T/T\text{total}$ as a variable and an indentation hardness distribution at $0.9 \leq T/T\text{total} \leq 1$ that is approximated by a second line having $T/T\text{total}$ as a variable, where Ttotal is a thickness of the hard carbon coating in and T is a thickness position from the base member side of the hard carbon coating in μm; and
H2 and T2 satisfy Expression (1) and Expression (2), where H1 is the indentation hardness of the hard carbon coating in GPa at T=0 μm on the first line, H2 is the indentation hardness of the hard carbon coating in GPa at an intersection between the first line and the second line, T2 is the thickness position at the intersection in μm, and H3 is the indentation hardness of the hard carbon coating in GPa at T=Ttotal on the second line, $$(H3-H1) \times T2/T\text{total} + H1 < H2 \leq 0.9 \times H1 \quad (1),$$

$$0.6 \leq T2/T\text{total} \leq 0.9 \quad (2).$$

[2] The sliding member of [1], wherein H2 further satisfies Expression (3), $$H2 \leq 0.6 \times H1 \quad (3).$$

[3] The sliding member of [1] or [2], wherein b/a further satisfies Expression (4), where a is a slope of the first line, and b is a slope of the second line, $$2 \leq b/a \leq 30 \quad (4).$$

[4] The sliding member of any one of [1] to [3], wherein H1 is 30 GPa or more.

[5] The sliding member of any one of [1] to [4], wherein H3 is 5 GPa or more and 20 GPa or less.

[6] The sliding member of any one of [1] to [5], wherein Ttotal is 3 μm or more.

[7] The sliding member of any one of [1] to [6], wherein a surface roughness Ra of the hard carbon coating is 0.15 μm or less.

[8] The sliding member of any one of [1] to [7], further comprising an intermediate layer between the base member and the hard carbon coating, the intermediate layer comprising one or more materials selected from among Cr, Ti, Co, V, Mo, and W, and carbides, nitrides, and carbonitrides thereof.

[9] A piston ring comprising the sliding member of any one of [1] to [8].

Advantageous Effect

The present disclosure can achieve a sliding member having a hard carbon coating that combines high wear resistance with a low coefficient of friction and has excellent peeling resistance. Furthermore, the present disclosure can achieve a piston ring formed by the sliding member.

DETAILED DESCRIPTION

Embodiments of a sliding member and a piston ring according to the present disclosure are described below with reference to FIGS. 1 to 4.

(Sliding Member)

Figure 1:
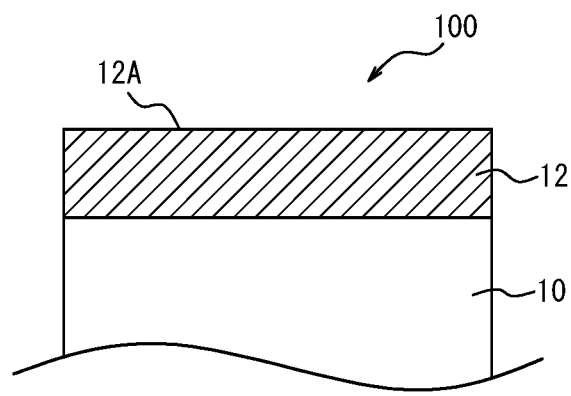
FIG. 1 is a schematic cross-sectional view of a sliding member 100 according to an embodiment of the present disclosure.

As illustrated in FIG. 1, a sliding member 100 according to the present embodiment includes the base member 10 and a hard carbon coating 12 formed on the base member 10.

[Base Member]

The base member 10 in the present embodiment may be any base member with the strength necessary for a sliding member. Examples of the material for the base member 10 include conductive materials such as iron, cast iron, cemented carbide, stainless steel, and aluminum alloys. When the material of the base member 10 is iron-based, the material may be subjected to hardening treatment and nitriding treatment, such as quenching and tempering. Use of conventionally applied martensitic stainless steel, spring steel, carbon steel, or the like as the material is preferred when the sliding member 100 is used as a piston ring.

[Hard Carbon Coating]

The hard carbon coating 12 in the present embodiment is a diamond-like carbon (DLC) coating 12. The characteristics of the DLC coating 12 are described below with reference to FIG. 2.

Figure 2:
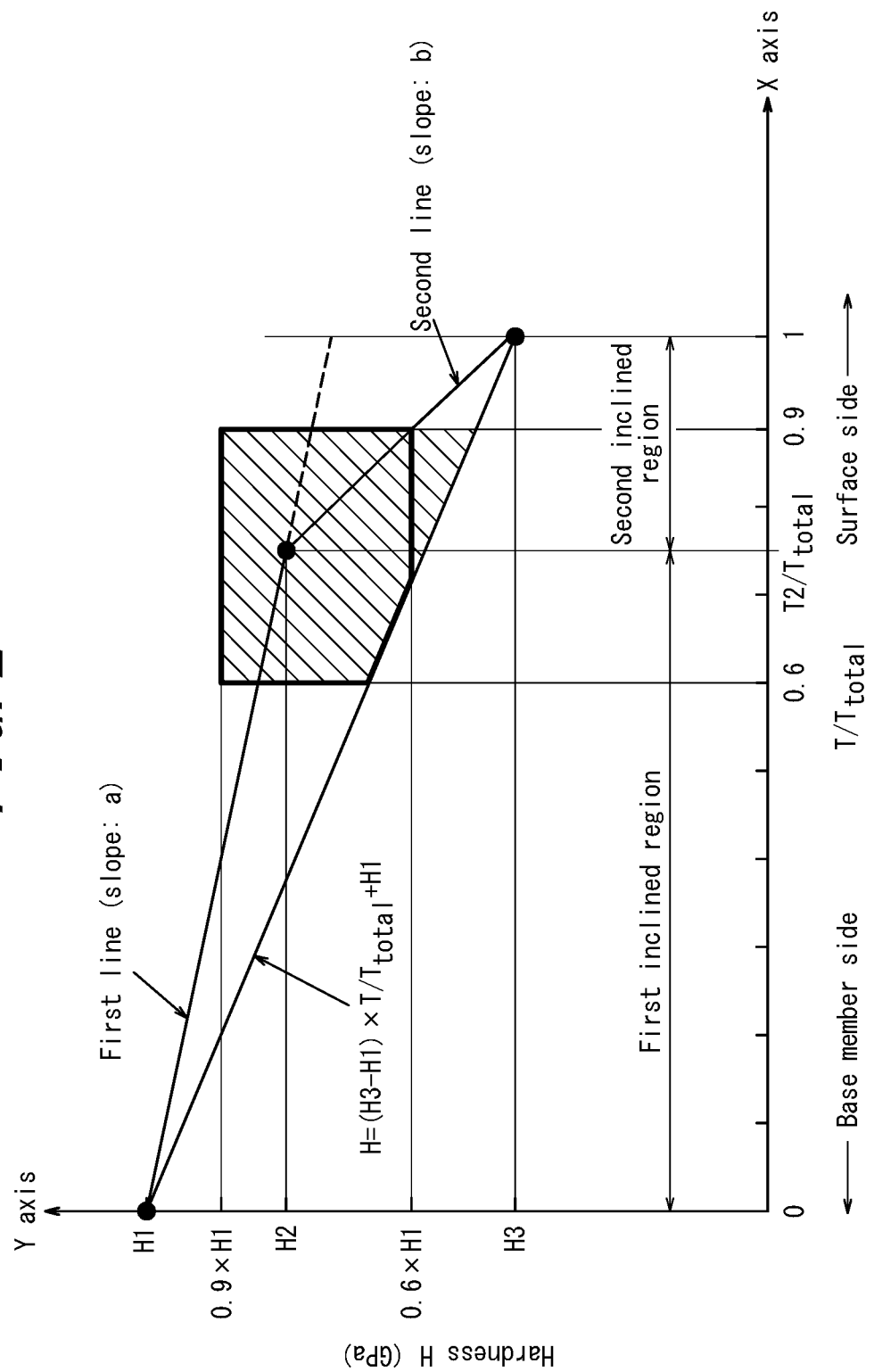
FIG. 2 is a graph illustrating the distribution of the indentation hardness of a DLC coating 12 vs. T/Ttotal in an embodiment of the present disclosure.
Figure 3A:
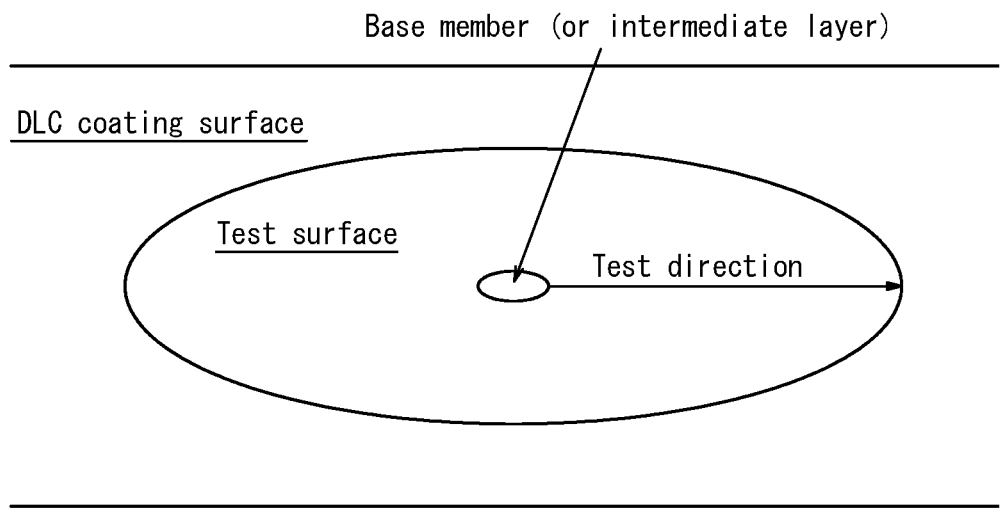
FIG. 3A illustrates a test surface exposed by bevel polishing, and a test direction on the test surface, during an indentation hardness test in an embodiment of the present disclosure.
Figure 3B:
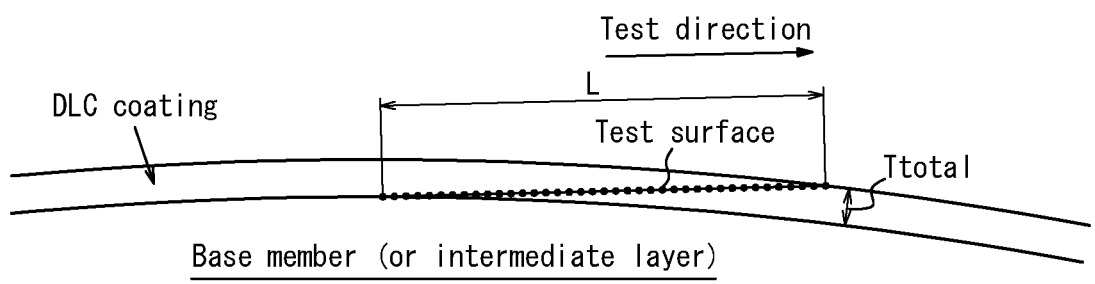
FIG. 3B illustrates the test surface and the test direction, during an indentation hardness test in an embodiment of the present disclosure, as viewed in a cross-section along the thickness direction of the DLC coating 12.

FIG. 2 illustrates the indentation hardness distribution of the DLC coating 12 in the XY plane when Ttotal (μm) is the thickness of the DLC coating 12, T (μm) is the thickness position from the base member side of the DLC coating 12, the horizontal axis (X axis) is T/Total, and the vertical axis (Y axis) is an indentation hardness H. The "indentation hardness distribution" in the present disclosure refers to a distribution of the indentation hardness calculated by the following test based on the nanoindentation hardness testing method prescribed by the international standard ISO14577. Specifically, the surface of the DLC coating 12 is subjected to planar polishing by "bevel polishing" to expose a test surface formed by the DLC coating, as illustrated in FIG. 3A. Here, as illustrated in FIG. 3B, bevel polishing is performed so that a test length L along a test direction becomes at least 30 times the thickness Ttotal of the DLC coating 12, and the test surface is formed as a mirror surface through final polishing by fine diamond polishing. In particular in a piston ring, the outer peripheral surface (surface of the DLC coating) is curved. Hence, a longer test length L than the thickness (Ttotal) can be obtained by exposing an elliptical test surface, as illustrated in FIG. 3A, by planar polishing of the outer peripheral surface. For example, for a piston ring with a nominal diameter φ of 60 mm or more, the test length L becomes at least 30 times the thickness (Ttotal) of the DLC coating 12 if at least a portion of the surface of the base member (base member or intermediate layer in the case of an intermediate layer being provided between the base member and the hard carbon layer) is exposed by bevel polishing and then polished until the ratio of the "length of the exposed base member (or intermediate layer) along the major axis of the test surface" to the "major axis of the test surface" becomes 30% or less. Next, a (Berkovich) diamond indenter with a tip shaped as a regular three-sided pyramid is pressed into the test surface along the test direction (major axis) with a pressing load of 6 mN to minimize the pressing depth, and the load on the indenter and the displacement of the indenter at this time are acquired continuously to yield a "load-displacement curve". If the performance of the indentation hardness tester allows the pressing depth to be reduced, a test with a pressing load of 6 mN or less may be performed. However, the pressing load when obtaining the hardness distribution needs to be the same throughout the test. Here, the intervals at which the diamond indenter is pressed (indicated by black circles in FIG. 3B) may be determined freely in accordance with the coating thickness but are preferably equal intervals insofar as possible in the 0≤T/Ttotal≤0.6 region and the 0.9≤T/Ttotal≤1 region. An automatic stage is often incorporated into an indentation hardness tester. For example, the indenter can be set automatically to be pressed continuously at intervals with a 5 μm pitch. Subsequently, the indentation hardness of the DLC coating 12 is calculated on the basis of the calculation method listed in ISO14577. Here, the DLC coating 12 is homogenous at the same thickness position. Therefore, the following conversion formula can be used to convert the indentation hardness along the test direction to the indentation hardness along the thickness direction from the base member side to the surface side of the DLC coating.

$$T=(a'+b)\times a/\phi$$

Figure 3C:
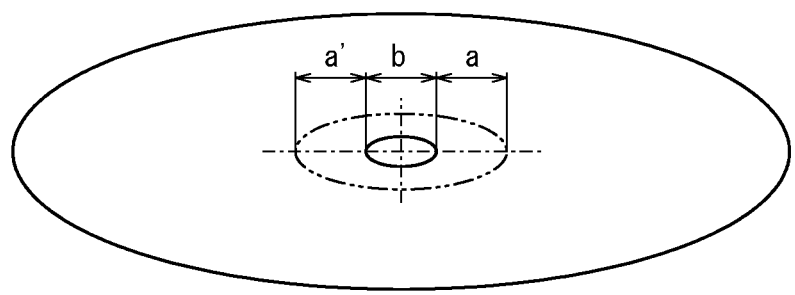
FIG. 3C illustrates the determination of parameters in a conversion formula for converting the indentation hardness along the test direction to the indentation hardness along the thickness direction from the base member side to the surface side of the DLC coating 12 during an indentation hardness test in an embodiment of the present disclosure.

Here, a mathematical formula for calculating the thickness in a Calo test typically used to measure the thickness of a thin film was applied as appropriate to the DLC coating with a curved surface. As also illustrated in FIG. 3C, a is the distance in the test direction from the boundary between the DLC coating and the base member (or intermediate layer), b is the length in the test direction of the exposed surface of the base member (or intermediate layer), a' (equal to a) is a parameter for conformity with the mathematical formula of a Calo test, and φ is the nominal diameter of the piston ring.

In the present embodiment, the indentation hardness distribution of the DLC coating 12 in the 0≤T/Ttotal≤0.6 region is approximated by a first line having T/Ttotal as a variable. The indentation hardness distribution of the DLC coating 12 in the $0.9 \leq T/Ttotal \leq 1$ region is approximated by a second line having T/Ttotal as a variable. The indentation hardness of the DLC coating 12 decreases gradually from the base member side to the surface side. The least squares method is preferably used for these approximations, and five or more data points are preferably used. In the present disclosure, "decreases gradually" refers to the slope (a) of the first line and the slope (b) of the second line both being negative.

Furthermore, H1 (GPa) is the indentation hardness of the DLC coating 12 at T=0 μm on the first line, H2 (GPa) is the indentation hardness of the DLC coating 12 at the intersection between the first line and the second line, T2 (μm) is the thickness position at the intersection, and H3 (GPa) is the indentation hardness of the DLC coating 12 at T=Ttotal on the second line. At this time, H2 and T2 satisfy Expression (1) and Expression (2) below. In other words, H2 is positioned in the hatched area in FIG. 2.

$$(H3-H1) \times T2/Ttotal + H1 < H2 \leq 0.9 \times H1 \quad (1),$$

$$0.6 \leq T2/Ttotal \leq 0.9 \quad (2).$$

With reference to FIG. 2, the technical significance of such a distribution for the indentation hardness distribution of the DLC coating 12 is explained. The DLC coating 12 has a first inclined region with an indentation hardness distribution approximated by the first line and a second inclined region with an indentation hardness distribution approximated by the second line. The indentation hardness changes continuously, increasing the peeling resistance, at the boundary between the first inclined region and the second inclined region defined by the intersection between the first line and the second line. Furthermore, the indentation hardness H2 at this boundary satisfies Expression (1), and the thickness position T2 at this boundary satisfies Expression (2). Wear resistance can therefore be secured by maintaining a high indentation hardness in the first inclined region, while the second inclined region can be caused to function as a conforming layer with a lower indentation hardness than the first region. Hence, the surface roughness can be reduced in a relatively short time during post-processing performed after the DLC coating is formed. These characteristics can make high wear resistance industrially compatible with a low coefficient of friction. With regard to Expression (1), the indentation hardness of H2 becomes excessively low if $(H3-H1) \times T2/Ttotal + H1 \geq H2$, impairing the wear resistance. H2 becomes excessively high if $H2 > 0.9 \times H1$, causing the hardness to change suddenly and impairing the peeling resistance. Considering how hardness correlates with coating residual stress, a sudden change in the residual stress could cause cracks to develop inside the DLC coating. With regard to Expression (2), the region of the conforming layer becomes narrow if $T2/Ttotal > 0.9$. Consequently, post-processing performed after the DLC coating is formed needs to be performed for a long time to reduce surface roughness, and the coefficient of friction often increases in industrial terms. The first region with a high indentation hardness becomes small if $T2/Ttotal < 0.6$, shortening the life of the coating.

To further increase the wear resistance in a high-load sliding environment, H2 preferably satisfies Expression (3) below. In other words, H2 is preferably positioned in the area enclosed in bold in FIG. 2.

$$H2 \leq 0.6 \times H1 \quad (3)$$

The slope a of the first line and the slope b of the second line preferably satisfy Expression (4).

$$2 \leq b/a \leq 30 \quad (4)$$

When b/a is 2 or more, the second inclined region can function more effectively as a conforming layer, and a lower coefficient of friction can be achieved by the change in hardness from the first inclined region. When b/a is 30 or less, a sudden change in hardness can be suppressed, and the development of cracks inside the coating can be inhibited. The reason is that cracks are more likely to develop inside the coating when the change in hardness is sudden.

H1 is preferably 30 GPa or more to secure the indentation hardness typically required for a DLC coating in a sliding member. If the hardness is excessively high, the residual stress inside the DLC coating also increases, making the DLC coating more susceptible to spontaneous peeling. Hence, H1 is preferably 60 GPa or less.

H3 is preferably 5 GPa or more and 20 GPa or less to secure the wear resistance of the DLC coating 12 and cause the surface layer to function sufficiently as a conforming layer.

The surface roughness Ra of the DLC coating 12 is preferably 0.15 μm or less. The reason is that a lower coefficient of friction can often be obtained as the surface roughness Ra is lower. Here, since the DLC coating 12 includes the second inclined region as a conforming layer, a known or freely chosen lapping process may be performed on the surface 12A of the DLC coating 12 to reduce the surface roughness Ra in a shorter time than with a known DLC coating. The "surface roughness Ra" in the present disclosure refers to the average roughness Ra prescribed by JIS B 0601 (2001).

The DLC coating 12 with these characteristics can be obtained by subjecting a DLC coating, formed on the base member 10 by ion plating, to ion bombardment. The method of producing the DLC coating 12 is described below.

First, a DLC coating is formed on the base member 10 by ion plating. Specifically, a carbon cathode is evaporated using a vacuum arc discharge in a vacuum atmosphere of $1 \times 10^{-1}$ Pa or less and ionized to deposit ionized carbon on the surface of a base member 10 to which a negative bias voltage is applied. A DLC coating is thus formed on the base member 10. Ion plating includes a filtered cathodic vacuum arc (FCVA) method that uses a magnetic filter to trap and remove carbon that is not ionized at the time of evaporation. The method of adjusting hardness does not depend on whether a magnetic filter is used.

This process can be performed by gradually decreasing the arc current at a rate such that the time average value per unit becomes 1 to 30 A/time. Typically, a DLC coating device for ion plating often has a plurality of evaporation sources for the effective coating region of the base member 10, and the arc current and discharge time are made uneven to achieve a good coating thickness distribution. The time average value per unit is the average of the rate for each evaporation source. Alternatively, the heater temperature may be gradually increased at a rate of 10 to 200° C./time. Consequently, the temperature of the base member increases gradually in a range of 100° C. to 220° C., allowing the indentation hardness of the DLC coating to be decreased gradually from the base member side to the surface side. If the difference between the temperature of the base member 10 due to ion plating (100° C. to 220° C.) and the temperature of the base member 10 after ion bombardment becomes 20° C. or less, however, the rate of decrease in hardness in the first inclined region becomes smaller, making it difficult to keep H2 equal to or less than 0.9×H1. To set H1 from 30 GPa or more to 60 GPa or less, the arc discharge at the start of coating is preferably 40 A or more and 100 A or less per unit. To reach a coating thickness of 3 µm or more, the negative bias voltage is preferably 0 V or more and less than 150 V.

In this step, the DLC coating is formed until the thickness reaches the desired thickness Ttotal. The indentation hardness distribution of the DLC coating formed in this step is not yet the two-stage indentation hardness distribution of the present embodiment and has a linear distribution represented by the first line and the dashed extension thereof in FIG. 2.

Subsequently, the process is switched to ion bombardment. In other words, the DLC coating formed by ion plating is subjected to ion bombardment. At this time, the bias voltage, the discharge current, the processing time, and the base member temperature are appropriately adjusted within the below-described ranges so that the indentation hardness distribution of the DLC coating at T2/Ttotal≤T/Ttotal≤1 changes from the distribution represented by the dashed line to the distribution represented by the second line in FIG. 2.

Ion bombardment has conventionally been used as preprocessing of vacuum deposition for sputter cleaning, with inert gas ions, of impurities adhered to the surface of the base member. In the present embodiment, however, ion bombardment can be used for a completely different purpose than sputter cleaning, i.e. to change the indentation hardness distribution of the DLC coating. The conditions on ion bombardment are described below.

The magnitude of the negative bias voltage is preferably 400 V or more and 900 V or less. If the negative bias voltage is less than 400 V, formation of a carbon coating dominates over the change in hardness from the ion bombardment. If the negative bias voltage exceeds 900 V, the temperature of the base member 10 rises excessively. The discharge current per unit is preferably 40 A or more and 80 A or less. At a discharge current per unit of less than 40 A, the arc discharge is unstable, whereas if the discharge current per unit exceeds 80 A, the temperature of the base member 10 rises excessively. The processing time of the ion bombardment is preferably 0.1 minutes or more and less than 5 minutes. If the processing time is less than 0.1 minutes, the temperature increase of the base member 10 is ineffective, and T2/Ttotal ends up exceeding 0.9. If the processing time exceeds 5 minutes, the temperature of the base member 10 rises excessively, and T2/Ttotal ends up below 0.6. When the bias voltage is 400 V or more and 900 V or less, and the discharge current per unit is 40 A or more and 80 A or less, an increase in the absolute value of the bias voltage raises the temperature of the base member 10, and the hardness of the DLC coating 12 (H2 and H3) tends to decrease. An increase in the discharge current also raises the temperature of the base member 10, and the hardness of the DLC coating 12 (H2 and H3) tends to decrease. The temperature of the base member 10 during ion bombardment is preferably 300° C. or more and 450° C. or less.

In this way, a sliding member having a hard carbon coating that combines high wear resistance with a low coefficient of friction and has excellent peeling resistance can be obtained. The second inclined region is preferably obtained by performing ion bombardment, under the above conditions, on a DLC coating formed by ion plating, as in the present embodiment. However, the present disclosure is not limited to this example. For example, after forming the DLC coating until the first inclined region has the desired thickness (desired T2), the second inclined region may then be formed continuously. At this time, the coating conditions are adjusted appropriately to gradually reduce the hardness of the second inclined region. Specifically, at least one of the arc current and the heater temperature is adjusted appropriately within the following ranges. Regarding the arc current, the time average value per unit is gradually increased at a rate of 5 to 30 A/time. If the arc current is gradually increased at a rate below 5 A/time, the rate of decrease in hardness in the second inclined region becomes smaller than the rate of decrease in hardness in the first inclined region, and H2 ends up equal to or less than (H3−H1)×T2/Ttotal+H1. The heater temperature is gradually raised at a rate of 50 to 300° C./time. As a result, the temperature of the base member 10 can appropriately be raised gradually in a range from 180° C. to 320° C., and the indentation hardness distribution of the DLC coating at T2/Ttotal≤T/Ttotal≤1 can be changed from the distribution represented by the dashed line to the distribution represented by the second line in FIG. 2.

To form a DLC coating having the first inclined region and the second inclined region by ion bombardment, Ttotal is preferably 3 µm or more and more preferably 5 µm or more. From the perspective of productivity, Ttotal is preferably 30 µm or less.

The DLC coating 12 may be a coating that includes hydrogen or a coating that has nearly no hydrogen (for example, 3 at % or less). In particular, when the DLC coating 12 is applied to a piston ring, the effect of wear resistance can be further improved by the hydrogen content being 5 at % or less.

A sliding member of the present disclosure has been described by an exemplary embodiment, but the present disclosure is not limited to this embodiment. Appropriate changes may be made within the scope of the patent claims.

For example, to increase the adhesion of the hard carbon coating with respect to the base member, an intermediate layer formed from one or more materials selected from among Cr, Ti, Co, V, Mo, and W, and carbides, nitrides, and carbonitrides thereof may be provided between the base member and the hard carbon coating. The thickness of the intermediate layer is preferably 0.01 µm or more and 0.6 µm or less and is more preferably 0.02 µm or more and 0.5 µm or less. A thickness of 0.01 µm or more can improve the adhesion of the hard carbon coating, and a thickness of 0.6 µm or less reduces the likelihood of the intermediate layer undergoing plastic flow during sliding and makes the hard carbon layer less likely to peel. The intermediate layer can, for example, be formed on the base member by appropriately using a known or freely chosen physical vapor deposition (PVD) method.

(Piston Ring)

Figure 4:
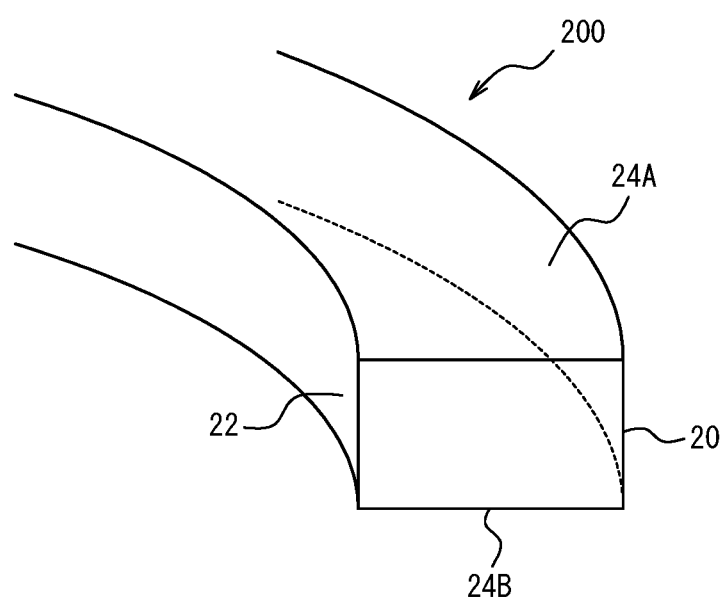
FIG. 4 is a cross-sectional perspective view of a piston ring 200 according to an embodiment of the present disclosure.

As illustrated in FIG. 4, a piston ring 200 according to an embodiment of the present disclosure is formed by the above-described sliding member 100, and an outer peripheral surface 20 of the piston ring 200 is the surface 12A of the DLC coating in FIG. 1. Since the outer peripheral surface 20 that becomes the sliding surface is the surface 12A of the DLC coating, which combines high wear resistance with a low coefficient of friction and has excellent peeling resistance, the piston ring 200 has high wear resistance and excellent peeling resistance even in a high-load sliding environment. An inner peripheral surface 22 and top and bottom surfaces 24A, 24B of the piston ring need not have the structure illustrated in FIG. 1.

In addition to a piston ring, the sliding member 100 according to an embodiment of the present disclosure can also be applied to a valve lifter or shim, which are valve parts of an internal combustion engine such as an automobile; a piston pin, compressor, or hydraulic vane pump, which are parts of an internal combustion engine; or the like.

Examples

As Examples and Comparative Examples, piston rings were produced under the following conditions so that the outer peripheral surface of the piston rings illustrated in FIG. 4 became the surface of the DLC coatings listed in Table 1.

In the Examples and Comparative Examples, a known PVD method was used to form a 0.4 μm thick intermediate layer made of chrome on a base member of silicon chrome steel with a nominal diameter of 80 mm, a thickness of 2.5 mm, and a width of 1.2 mm. Next, ion plating by vacuum arc discharge using a carbon target was performed in a vacuum atmosphere of $1\times10^{-1}$ Pa or less while appropriately adjusting the bias voltage, the arc current, the discharge time, and the temperature of the base member within the above-described ranges to form DLC coatings with the thicknesses Ttotal listed in Table 1 on the intermediate layer. Subsequently, ion bombardment was performed while adjusting the bias voltage, the discharge current, the processing time, and the temperature of the base member appropriately within the above-described ranges to obtain DLC coatings having the indentation hardness distributions listed in Table 1. In Example 2, however, the second inclined region was not formed after the first inclined region by ion bombardment, but rather using ion plating while appropriately adjusting the arc current and the heater temperature within the above-described ranges. In Comparative Example 2, coating was suspended after formation of the first inclined region by ion plating at a base member temperature of 190° C. or less. The heater temperature was then raised, and after the base member was held until the base member temperature exceeded 240° C., coating was resumed to form the second inclined region.

(Explanation of Evaluation Method and Evaluation Results)

Using the above-described method, the outer peripheral surface of the piston ring was bevel polished until the ratio of the "length of the base member or intermediate layer along the major axis of the test surface" to the "major axis of the test surface" become 20% or less, and an indentation hardness test was performed on the Examples and the Comparative Examples. Depending on the coating thickness, L/Ttotal was a factor of 35 to 100 for the Examples and the Comparative Examples. ENT-1100a produced by Elionix Inc. was used as an indentation hardness tester. The hardness distribution in the depth direction of the DLC coating was obtained by setting the pressing load to 6 mN and continuously pressing the indenter into the test surface at equal intervals with a 5 μm pitch. The coating thickness in the Examples and Comparative Examples was measured by observing a cross-section of the DLC coating with a scanning electron microscope (SEM). The wear resistance (coating life), coefficient of friction, and peeling resistance of the Examples and Comparative Examples were evaluated using the following methods.

<Wear Resistance (Coating Life)>

Figure 5A:
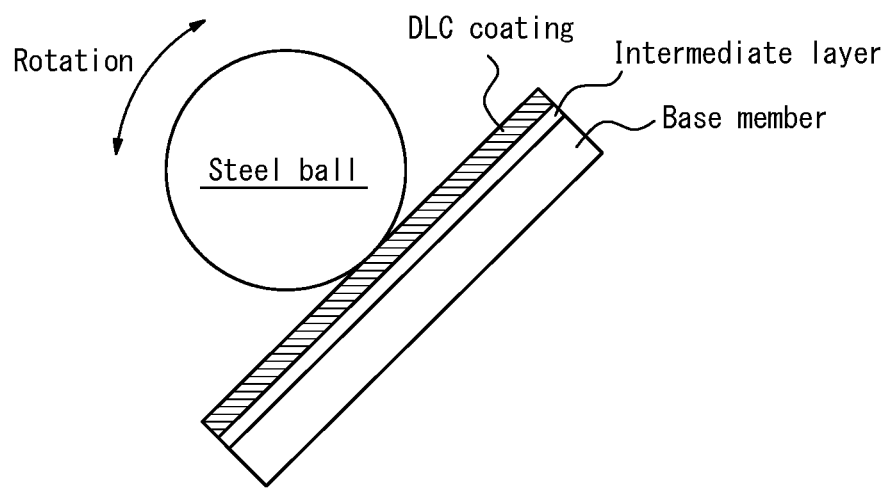
FIG. 5A is a schematic view of a tester used in a simple abrasive wear test.

A simple abrasive wear test was performed on the Examples and Comparative Examples. In the simple abrasive wear test, a diamond paste was applied to the surface of the DLC coating as an abrasive, the DLC coating was polished by rotation of a steel ball on the surface of the DLC coating as illustrated in FIG. 5A, and the polishing marks were observed periodically. The time until exposure of the surface of the base member was determined to be the attrition time. A Calo test typically used to measure the thickness of a thin film was thus treated as a simple abrasive wear test by managing the polishing conditions. Reference samples for the Examples and Comparative Examples were produced by the following method. The reference samples were produced by performing ion plating, over the entire coating thickness of the DLC coating, on samples having the same indentation hardness as H1 of the Examples and Comparative Examples. The test pieces were in an as-coat state. Apart from the indentation hardness of the DLC coating, the reference samples were similar to the Examples and Comparative Examples. A similar simple abrasive wear test was performed on each reference sample, and the time until exposure of the surface of the base member was determined to be the reference attrition time. The attrition time ratio (attrition time/reference attrition time) was calculated for each Example and Comparative Example to evaluate the wear resistance. Table 1 lists the evaluation results. An attrition time ratio of 0.70 or more was considered to indicate high wear resistance (coating life). Hence, 0.70 or more for the attrition time ratio is listed as "good" and less than 0.70 as "poor" in Table 1. The test conditions were as follows.

Test steel ball: SUJ2 ϕ 31.75 mm

Diamond paste: 0.25 μm

Steel ball rotation speed: 500 rpm

<Peeling Resistance and Low Coefficient of Friction>

Figure 5B:
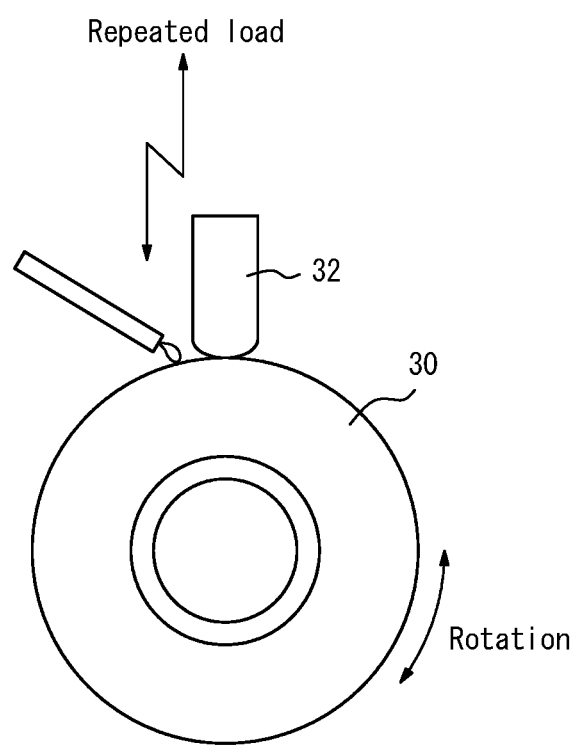
FIG. 5B is a schematic view of a tester used in a rolling contact fatigue test.

A rolling contact fatigue test was performed on the Examples and Comparative Examples as an evaluation allowing rapid re-creation of peeling in an actual tester. FIG. 5B is a schematic view of the tester. In the rolling contact fatigue test, the peeling resistance of the DLC coating can be confirmed in a relatively short time by repeatedly applying a load to a test piece 32 that slides against a rotating drum 30. Here, the test piece 32 was obtained by cutting each piston ring of the Examples and Comparative Examples so that a portion of the outer peripheral surface of the piston ring became the sliding surface in the rolling contact fatigue test. The DLC surface of these piston ring peripheral surfaces was subjected to a predetermined lapping process. The peeling resistance was evaluated by using a light microscope to observe whether peeling had occurred at the post-test sliding surface of the test piece 32. The coefficient of friction was also evaluated by detecting the frictional force during the test. Table 1 lists the surface roughness of the piston ring outer peripheral surface and the evaluation results. In Table 1, 0.16 or less for the coefficient of friction is listed as "good", and more than 0.16 as "poor". The test conditions were as follows.

Load: 20 N to 50 N, sine curve 50 Hz

Counterpart material (drum): 80 mm diameter SUJ2 material

Sliding speed: forward/reverse pattern operation (±10 m/s), held for 20 sat speed of ±10 m/s Acceleration: 0.23 m/s$^2$ Lubricant: additive-free motor oil, 0.1 cc/min Temperature: drum surface temperature of 80° C.

Test time: 10 cycles, with forward/reverse pattern operation as one cycle

Coefficient of friction: initial coefficient of friction until 5 cycles

TABLE 1

| Classification | H1 (GPa) | H3 (GPa) | H2 (GPa) | Value of leftmost side of Exp. (1) | Value of rightmost side of Exp. (1) | Judgment regarding Exp. (1) *1 | Ttotal (μm) | T2/Ttotal | Judgment regarding Exp. (2) *2 | 0.6 × H1 |
|---|---|---|---|---|---|---|---|---|---|---|
| Ex. 1 | 40.0 | 12.0 | 30.0 | 18.7 | 36.0 | good | 5.9 | 0.76 | good | 24.0 |
| Ex. 2 | 45.0 | 19.0 | 38.6 | 28.4 | 40.5 | good | 29 | 0.64 | good | 27.0 |
| Ex. 3 | 40.3 | 5.3 | 26.0 | 18.3 | 36.3 | good | 22.6 | 0.63 | good | 24.2 |
| Ex. 4 | 31.0 | 7.1 | 16.3 | 10.0 | 27.9 | good | 11 | 0.88 | good | 18.6 |
| Ex. 5 | 31.0 | 10.0 | 26.6 | 12.3 | 27.9 | good | 20.4 | 0.89 | good | 18.6 |
| Comp. Ex. 1 | 34.6 | 21.0 | 23.6 | 22.1 | 31.1 | good | 19.5 | 0.92 | poor | 20.8 |
| Comp. Ex. 2 | 35.3 | 13.0 | 13.0 | −20.7 | 31.8 | good | 23 | 2.51 | poor | 21.2 |
| Comp. Ex. 3 | 55.5 | 9.0 | 14.9 | 22.5 | 50.0 | poor | 8 | 0.71 | good | 33.3 |
| Comp. Ex. 4 | 50.4 | 17.0 | 38.7 | 31.4 | 45.4 | good | 13 | 0.57 | poor | 30.2 |
| Comp. Ex. 5 | 49.3 | 8.0 | 45.8 | 18.3 | 44.4 | poor | 16 | 0.75 | good | 29.6 |
| Comp. Ex. 6 | 32.0 | 30.0 | 31.8 | 30.2 | 28.8 | poor | 6 | 0.90 | good | 19.2 |

| Classification | Judgment regarding Exp. (3) *3 | b/a | Judgment regarding Exp. (4) *4 | Wear resistance (life) Attrition time ratio | Low coefficient of friction Surface roughness Ra (μm) | Coefficient of friction | Peeling resistance |
|---|---|---|---|---|---|---|---|
| Ex. 1 | good | 5.72 | good | 0.80 good | 0.11 | good | no |
| Ex. 2 | good | 5.50 | good | 0.80 good | 0.09 | good | no |
| Ex. 3 | good | 2.47 | good | 0.75 good | 0.08 | good | no |
| Ex. 4 | poor | 4.74 | good | 0.70 good | 0.07 | good | no |
| Ex. 5 | good | 29.00 | good | 0.90 good | 0.15 | good | no |
| Comp. Ex. 1 | good | 1.99 | poor | 0.80 good | 0.16 | poor | no |
| Comp. Ex. 2 | poor | 0.00 | poor | 0.80 good | 0.09 | good | yes |
| Comp. Ex. 3 | poor | 0.35 | poor | 0.40 poor | 0.07 | good | no |
| Comp. Ex. 4 | good | 2.41 | good | 0.50 poor | 0.11 | good | no |
| Comp. Ex. 5 | good | 32.63 | poor | 0.70 good | 0.16 | good | yes |
| Comp. Ex. 6 | good | 81.00 | poor | 0.95 good | 0.21 | poor | yes |

*1-4: "good" when satisfying Expressions (1)-(4), "poor" otherwise

In Comparative Example 1, T2/Ttotal exceeded 0.9, b/a was less than 2, the second inclined region was narrow, and the indentation hardness at the surface layer could not be sufficiently reduced, as illustrated in Table 1. Therefore, the surface roughness could not be sufficiently reduced by the lapping process during post-processing, resulting in a high coefficient of friction. In Comparative Example 2, T2/Ttotal was not in the range of 0.6 to 0.9, the slope of the second inclined region was close to 0, b/a was approximately 0, and the indentation hardness at the boundary between the first inclined region and the second inclined region changed discontinuously, yielding inferior peeling resistance. In Comparative Example 3, b/a was 1 or less, and a concave hardness distribution was observed, with the indentation hardness decreasing in the majority of the thickness direction of the DLC coating. This yielded inferior wear resistance. In Comparative Example 4, T2/Ttotal was less than 0.6, and the second inclined region extended to near the base member, yielding inferior wear resistance. In Comparative Example 5, H2 exceeded 0.9×H1, and b/a exceeded 30. The change in indentation hardness therefore became excessive, yielding inferior peeling resistance. In Comparative Example 6, the indentation hardness was nearly constant but changed suddenly near the surface layer, yielding inferior peeling resistance. Additionally, the DLC coating was still hard near the surface, preventing the surface roughness from being sufficiently reduced by a lapping process during post-processing. This resulted in a high coefficient of friction. By contrast, in Examples 1 to 5, the indentation hardness changed continuously at the border between the first inclined region and the second inclined region. The indentation hardness H2 at this boundary satisfied Expression (1), and the thickness position T2 satisfied Expression (2), thereby combining high wear resistance with a low coefficient of friction and achieving excellent peeling resistance. In particular, Examples 1 to 3 and 5 satisfied Expression (3), yielding higher wear resistance.

INDUSTRIAL APPLICABILITY

The present disclosure can achieve a sliding member having a hard carbon coating that combines high wear resistance with a low coefficient of friction and has excellent peeling resistance. Furthermore, the present disclosure can achieve a piston ring formed by the sliding member.

REFERENCE SIGNS LIST

100 Sliding member
10 Base member
12 Hard carbon coating (DLC coating)
12A Sliding surface
200 Piston ring
20 Outer peripheral surface
22 Inner peripheral surface
24A, 24B Upper and lower surfaces
30 Drum
32 Test piece

The invention claimed is:

1. A sliding member comprising a base member and a hard carbon coating formed on the base member;
wherein an indentation hardness of the hard carbon coating decreases gradually from the base member side to a surface side of the hard carbon coating;
wherein the hard carbon coating has an indentation hardness distribution at $0 \leq T/T_{total} \leq 0.6$ that is approximated by a first line having $T/T_{total}$ as a variable and an indentation hardness distribution at $0.9 \leq T/T_{total} \leq 1$ that is approximated by a second line having $T/T_{total}$ as a variable, where $T_{total}$ is a thickness of the hard carbon coating in μm, and T is a thickness position from the base member side of the hard carbon coating in μm; and
wherein H2 and T2 satisfy Expression (1) and Expression (2), where H1 is the indentation hardness of the hard carbon coating in GPa at T=0 μm on the first line, H2 is the indentation hardness of the hard carbon coating in GPa at an intersection between the first line and the second line, T2 is the thickness position at the intersection in μm, and H3 is the indentation hardness of the hard carbon coating in GPa at T=Ttotal on the second line, $$(H3-H1) \times T2/T_{total} + H1 < H2 \leq 0.9 \times H1 \quad (1),$$

$$0.6 \leq T2/T_{total} \leq 0.9 \quad (2).$$

2. The sliding member of claim 1, wherein H2 further satisfies Expression (3), $$H2 \leq 0.6 \times H1 \quad (3).$$

3. The sliding member of claim 1, wherein b/a further satisfies Expression (4), where a is a slope of the first line, and b is a slope of the second line, $$2 \leq b/a \leq 30 \quad (4).$$

4. The sliding member of claim 1, wherein H1 is 30 GPa or more.

5. The sliding member of claim 1, wherein H3 is 5 GPa or more and 20 GPa or less.

6. The sliding member of claim 1, wherein Ttotal is 3 μm or more.

7. The sliding member of claim 1, wherein a surface roughness Ra of the hard carbon coating is 0.15 μm or less.

8. The sliding member of claim 1, further comprising an intermediate layer between the base member and the hard carbon coating, the intermediate layer comprising one or more materials selected from among Cr, Ti, Co, V, Mo, and W, and carbides, nitrides, and carbonitrides thereof.

9. A piston ring comprising the sliding member of claim 1.

* * * * *